United States Patent [19]

Bradshaw

[11] Patent Number: 4,638,252
[45] Date of Patent: Jan. 20, 1987

[54] CIRCUIT FOR DETECTING RF COIL ASSEMBLY POSITION IN AN MR SCANNER

[75] Inventor: Kenneth M. Bradshaw, Waukesha, Wis.

[73] Assignee: General Electric Company, Milwaukee, Wis.

[21] Appl. No.: 684,553

[22] Filed: Dec. 21, 1984

[51] Int. Cl.$^4$ .............................................. A61B 5/05
[52] U.S. Cl. ................................... 324/318; 128/653; 324/300
[58] Field of Search ............... 324/318, 322, 309, 300; 128/653; 378/20, 117

[56] References Cited

U.S. PATENT DOCUMENTS

| 4,411,270 | 10/1983 | Danadian | 128/653 |
| 4,558,458 | 12/1985 | Katsumata et al. | 378/20 |
| 4,567,894 | 2/1986 | Bergman | 128/653 |

FOREIGN PATENT DOCUMENTS

| 0152990 | 12/1979 | Japan | 378/20 |

Primary Examiner—Stephen A. Kreitman
Assistant Examiner—Scott M. Oldham
Attorney, Agent, or Firm—Alexander M. Gerasimow; Douglas E. Stoner

[57] ABSTRACT

A circuit for detecting the position of a radio frequency (RF) coil assembly in a magnetic resonance (MR) scanner includes, in the preferred embodiment, a normally closed switch connected to ground in parallel with a PIN diode which forms part of a transmit/receive (T/R) switch used to selectively couple the RF coil assembly to an RF power amplifier and an RF receiver preamplifier. The switch is operable by an actuating rod mounted to the RF coil assembly structure, whose position is to be sensed, such that when the assembly is in place the switch contacts are closed, and open when the assembly is not in place. The opening and closing of the switch shunts the PIN diode in and out, respectively, of the T/R switch circuit, thereby changing the voltage drop across other PIN diodes in the circuit. This change is sensed by a comparator circuit, the output of which is indicative of the RF coil assembly position.

3 Claims, 6 Drawing Figures

CIRCUIT FOR DETECTING RF COIL ASSEMBLY POSITION IN AN MR SCANNER

BACKGROUND OF THE INVENTION

This invention relates to magnetic resonance (MR) apparatus. More specifically, this invention relates to a means for sensing whether the upper assembly of a two-piece radio frequency (RF) head coil in MR scanner is properly positioned for performing MR scans.

The magnetic resonance phenomenon has been utilized in the past in high resolution MR spectroscopy instruments by structural chemists to analyze the structure of chemical compositions. More recently, MR has been developed as a medical diagnostic modality having application in imaging the anatomy, as well as in performing in vivo, non-invasive, spectroscopic analysis. As is now well known, the MR resonance phenomenon can be excited within a sample object, such as a human patient, positioned in a homogeneous polarizing magnetic field, by irradiating the object with radio frequency (RF) energy at the Larmor frequency. In medical diagnostic applications, this is typically accomplished by positioning the patient to be examined in the field of an RF coil having a cylindrical geometry, and energizing the RF coil with an RF power amplifier. Upon cessation of the RF excitation, the same or a different RF coil is used to detect the MR signals emanating from the patient volume lying within the field of the RF coil. The MR signal is usually observed in the presence of linear magnetic field gradients used to encode spatial information into the signal. In the course of a complete MR scan, a plurality of MR signals are typically observed. The signals are used to derive MR imaging or spectroscopic information about the object studied.

A whole-body MR scanner used as a medical diagnostic device includes a magnet, frequently of solenoidal design, to produce the polarizing magnetic field. The bore of the magnet is made sufficiently large to accommodate RF, gradient, and shim coil assemblies, as well as the torso of a patient to be examined. The scanner also includes a table which supports a cradle used to retrievably position the patient within the bore of the magnet. The table is aligned longitudinally with the bore of the magnet and disposed at the same height to facilitate the advancement of the cradle between a home position when the cradle is on the table and an advanced position when the cradle is in the magnet. A bridge structure in the bore supports the cradle and the patient when the cradle is in the advanced position.

Typically, a whole-body MR scanner is provided with two RF coils of different sizes. The larger coil, termed the body coil, is constructed on a cylindrical coil form having a diameter sufficiently large (e.g., 60 cm) to accept the torso of a typical patient. The smaller coil also having a cylindrical geometry, but smaller diameter, is used for imaging the head. A particularly advantageous head coil is constructed from two separable sections, as disclosed and claimed in commonly assigned U.S. patent application Ser. No. 551,626, which is incorporated herein by reference.

Briefly, the head coil is made up of an upper and a lower assembly which together comprise the cylindrically configured head coil. Each assembly supports one half of the RF coil circuit. The lower assembly is secured to a patient cradle, while the upper assembly is slidably mounted to a cradle dolly, which resides on the bridge within the bore of the magnet. This configuration enhances patient comfort, since the patient's face remains unobstructed until just before the MR study begins, when the upper half is pulled into place on top of the lower assembly to form the complete coil. When the coil assemblies are in place, the coil circuit halves are inductively coupled and are capable of functioning as a single resonant circuit at substantially the same frequency when one of the circuits is energized.

It is desirable, when imaging the head, to detect whether the upper coil assembly is in place prior to the start of the MR study. It is further desirable to detect whether the upper coil assembly remains in place during the study. For example, the assembly could be inadvertently pushed out of position by the patient. Advantageously, detection should be accomplished through an existing RF coaxial cable coupled to the RF coil circuit in the upper assembly, thereby to minimize the number of connections. The sensing function should not interfere with operation of the RF cable as a means for applying RF energy to the coil and transmitting MR signals from the study object to an MR receiver.

It is, therefore, a principal object of the invention to provide means for sensing the position of the upper assembly of an RF coil through existing RF cable and without interference with normal operation of the cable.

SUMMARY OF THE INVENTION

An MR scanner includes an RF power amplifier, an RF receiver preamplifier, an RF coil assembly and a transmit/receive switch having a plurality of switching devices for selectively coupling the power amplifier and preamplifier to the coil assembly, which assembly is made up of an upper coil assembly disposed slidably relative to a lower coil assembly. The MR scanner further includes switch means operably coupled to the upper coil assembly to shunt at least one of the switching devices in and out of said transmit/receive switch depending on the position of the upper coil assembly so as to change the voltage drop across one of the unshunted switching devices. A comparator circuit means is provided for comparing the voltage drop to a predetermined reference voltage and providing an output signal indicative of the position of the upper coil assembly.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
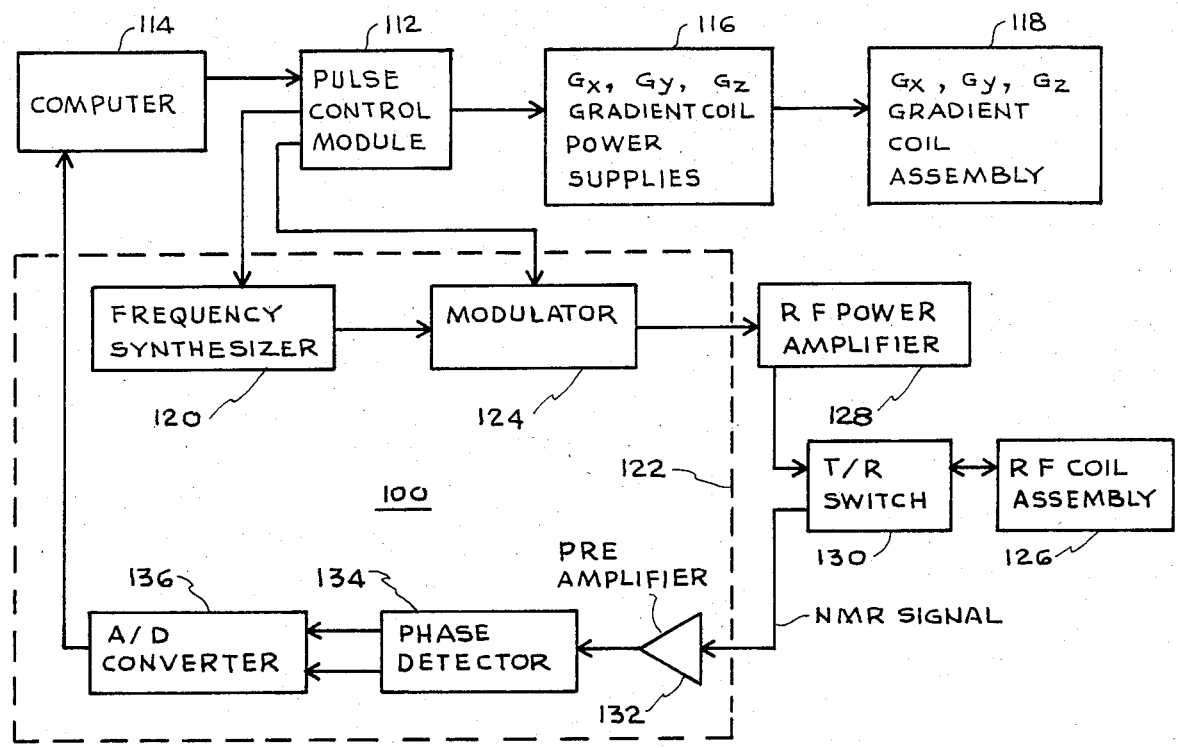
FIG. 1 depicts in block schematic form an exemplary MR system useful for practicing the invention.

FIG. 1 is a simplified block diagram of an imaging system with respect to which the invention will be disclosed. It should be recognized, however, that the claimed invention may be advantageously practiced with any suitable MR apparatus. The system, generally designated 100, includes a pulse control module 112 which provides properly timed pulse signal waveforms, under the control of a host computer 114, to magnetic field gradient power supplies, collectively designated 116, for energizing gradient coils which form part of a gradient coil assembly generally indicated by a block 118. The assembly contains coils which, when energized by the power supplies, produce the $G_x$, $G_y$, and $G_z$ magnetic field gradients (of the magnetic field in the z direction) directed in the x, y, and z directions, respectively, of the Cartesian coordinate system. The $G_x$, $G_y$, and $G_z$ gradients are used in MR imaging applications in a well-known manner to encode spatial information into MR signals.

Continuing with reference to FIG. 1, the pulse control module provides activating pulses to an RF synthesizer 120 which is part of an RF transceiver system, portions of which are enclosed by dash-line block 122. The pulse control module also supplies modulating signals to a modulator 124 which modulates the output of the RF frequency synthesizer. The modulated RF signals are applied to an RF coil assembly 126 through an RF power amplifier 128 and a transmit/receive switch 130. The RF signals are used to excite nuclear spins in a sample object (not shown) undergoing examination.

The MR signals from the excited nuclear spins are picked up by the RF coil assembly and applied through the transmit/receive switch to an RF preamplifier 132 and then to a quadrature phase detector 134. The detected signals are digitized by A/D converter 136 and applied to computer 114 for processing in a well-known manner to, for example, reconstruct MR images of the sample.

Figure 2:
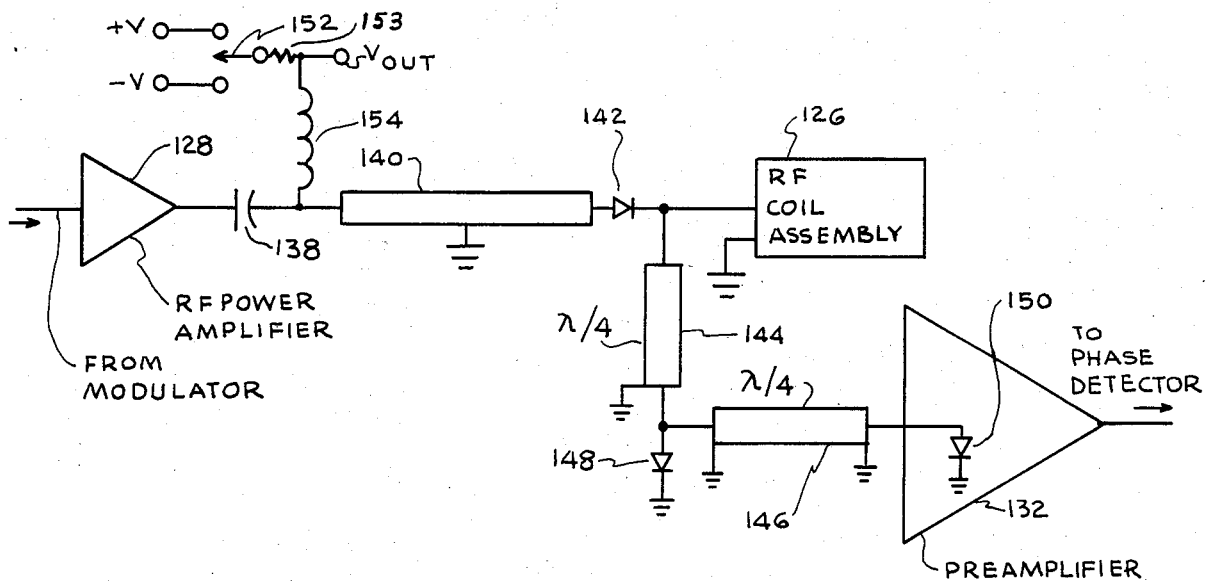
FIG. 2 depicts in block schematic form one embodiment of a transmit/receive (T/R) switch used to selectively couple the RF coil to either the transmitter or receiver of the MR system.

Reference is now made to FIG. 2 with respect to which transmit/receive switch (130, FIG. 1) structure and operation will be described. In FIG. 2, system elements described with reference to FIG. 1 are assigned like reference numbers. Thus, the output of RF power amplifier 128 is coupled to RF coil assembly 126 through series connected DC-blocking capacitor 138, a random length of RF coaxial cable 140, and a PIN diode device 142 having its anode connected to the coaxial cable and its cathode to the RF coil assembly. The RF coil assembly is coupled to RF preamplifier 132 through a pair of series-connected quarter wavelength sections 144 and 146 of coaxial cable. Coaxial cable section 146 is connected to ground at each end of its center conductor by a pair of PIN diode devices 148 and 150 having the respective anodes thereof connected to the center conductor and the cathodes to ground. The shield conductor of the coaxial cables is also connected to ground. PIN diode devices may each comprise a PIN diode device bearing standard industry designation 9415, used in the large signal mode. Of course, other devices exhibiting similar characteristics may be advantageously employed.

In the transmit mode a positive DC voltage (+V) of approximately 15 volts, for example, is selected by switch 152 and is applied through a resistor 153 (approximately 10 ohms in this example) and radio frequency choke 154 to the common point between DC-blocking capacitor 138 and coaxial cable 140 so as to forward bias PIN diodes 142, 148 and 150. In the forward biased state diode 142 permits RF power to be applied to the RF coil assembly. The grounding of the center conductor of each of quarter wavelength sections 144 and 146 by forward biased diodes 148 and 150, respectively, creates a high impedance path to ground. This prevents RF energy from reaching preamplifier 132. When the diodes are forward biased, the voltage at the $V_{OUT}$ terminal is equal to approximately 1.6–2.0 volts (at 1 ampere) equal to the sum of the voltage drops across diodes 142 and 148.

In the receive mode, a negative voltage (−V) of approximately −15 volts is selected by switch 152 to positively reverse bias diodes 142, 148 and 150. Under reverse bias conditions, all diodes appear to be open circuits thereby allowing MR signals received by the RF coil assembly to be applied to preamplifier 150.

Figure 2A:
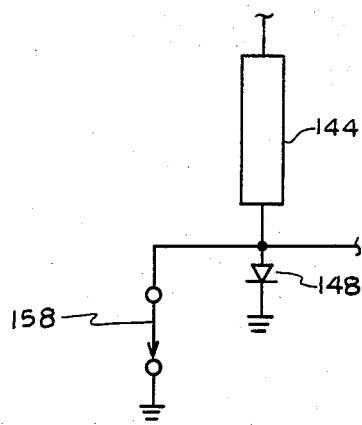
FIGS. 2A and 2B depict part of the transmit/receive switch, illustrated in FIG. 2, including alternative connecting points for a switch which forms part of the inventive circuit for detecting coil assembly position.
Figure 2B:
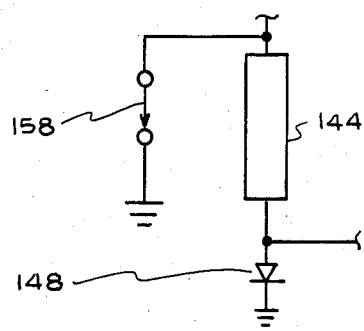

In accordance with the invention, it is possible to monitor the position of the upper coil assembly by providing a normally closed, low-inductance switch 158 connected at one end to the anode of diode 148 and at the other to ground, as shown in FIG. 2A. Alternatively, normally closed switch 158 could be connected from the cathode of diode 142 and ground, as shown in FIG. 2B. The embodiment of FIG. 2A is preferred since RF voltage levels in this point of the circuit are lower, thereby minimizing the chances of arcing within the switch due to high RF power levels (e.g., 16 kilowatts). With switch 158 closed and switch 152 connected to apply a +V voltage, to forward bias the diode, voltage $V_{OUT}$ is equal to approximately 0.8–1.0 volts (or the drop across diode 142). If, however, switch 158 is coupled to be operable by the upper coil assembly, as will be described hereinafter with reference to FIG. 4, such that it is open when the upper assembly is in place, $V_{OUT}$ is equal to approximately 1.6–2.0 volts (or the sum of the voltage drops across diodes 142 and 148). This difference in $V_{OUT}$ voltages provides a means by which the position of the upper assembly can be monitored. The manner in which this is accomplished will be described next with reference to FIG. 3.

Figure 3:
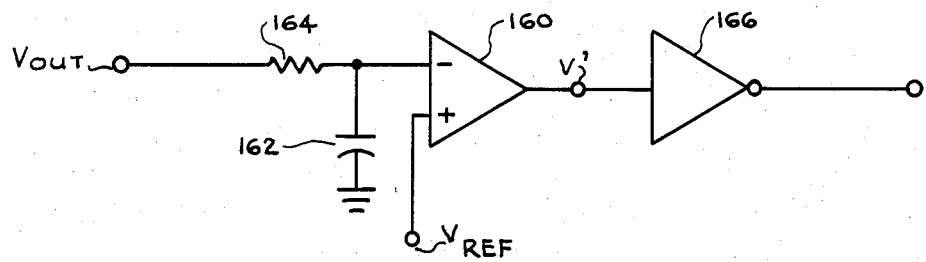
FIG. 3 depicts a circuit schematic of an exemplary comparator circuit useful with the T/R switch to sense when the upper coil assembly is in place.

Referring now to FIG. 3, there is shown a comparator circuit comprised of a differential amplifier 160 coupled at its inverting input to ground through a filter capacitor 162 and through an input resistor 164 to sense the $V_{OUT}$ voltage, as discussed with reference to FIG. 2. The differential amplifier is connected at its non-inverting input to a source of reference voltage ($V_{REF}$) of approximately 1.5 volts for this exemplary embodiment. The output voltage V' of the differential amplifier will be approximately 0 volts if $V_{OUT}$ is greater than approximately 1.6–2.0 volts (upper coil assembly is in place). Voltage V' is approximately 5 volts when $V_{OUT}$ is less than, approximately, 1.5 volts (upper coil assembly not in place). Thus, output V', sensed through a buffer circuit 166, can be used to monitor upper coil assembly position prior to initiating an MR study or the displacement of the assembly in the course of a study, without requiring additional cable connections.

The manner in which the upper coil assembly activates switch 158 will now be described with reference to FIG. 4 which depicts a cross-sectional view of an MR magnet 168, typically of superconductive solenoidal design, having a bore 170 for receiving a patient transport cradle 172 for performing an MR study. In the "home" position, the cradle rests on top of a mobile patient transport table 174 which is shown docked to the magnet by means of a docking mechanism generally designated 176. A transport dolly 178, supported in the bore of the magnet by a bridge structure 180, is capable of engaging the cradle for bidirectional movement (as suggested by bidirectional arrow 182) to an advanced position within the bore and for returning it to the home position on the transport table.

Figure 4:
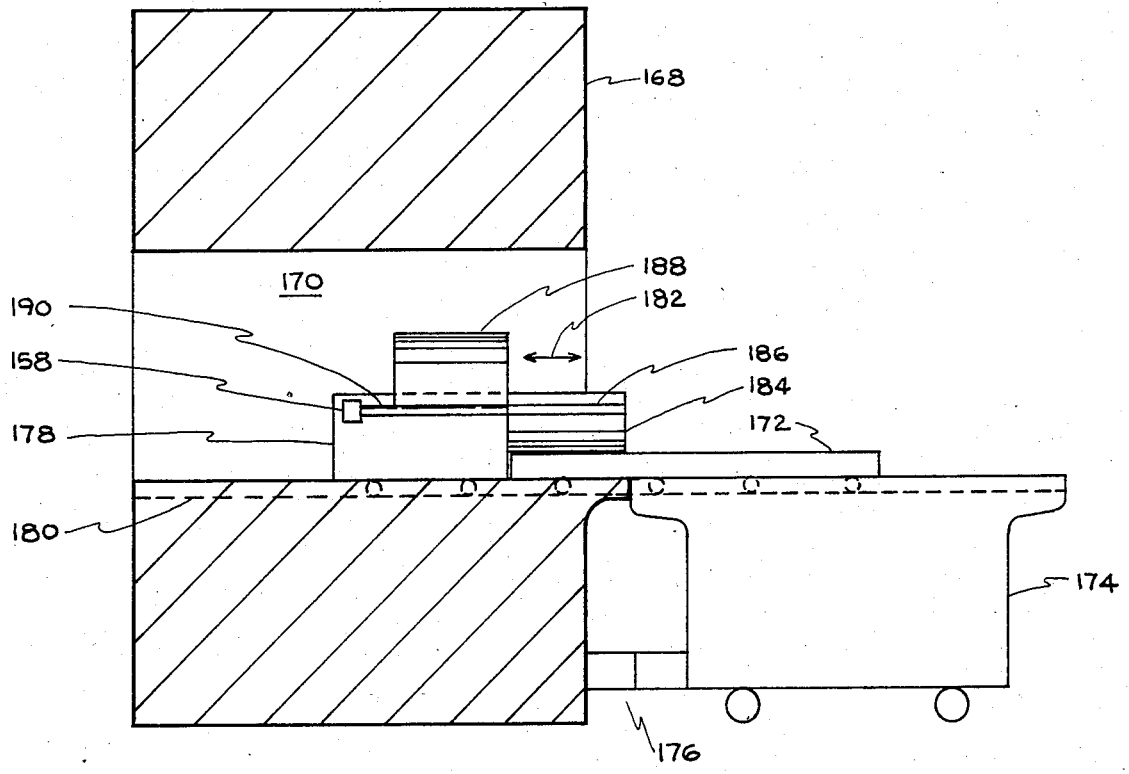
FIG. 4 depicts a partially cut-away view of an MR system indicating one embodiment for actuating the switch depicted in FIGS. 2A and 2B.

Continuing with refernce to FIG. 4, the lower coil assembly, designated 184, is mounted to the cradle and performs the dual function of housing the lower coil circuit (not shown) and as a head rest for the patient. The lower coil assembly is provided with rails (one of which is designated 186) to slidably receive upper coil assembly 188 which is slidably mounted to the transport dolly. Upper coil assembly 188 is provided with an actuating rod 190 which operates switch 158. In the position depicted in FIG. 4 (i.e., upper assembly out of position), the contacts of switch 158 are closed such that $V_{OUT}$ is less than 1.5 volts and comparator output voltage V' is 5 volts, indicating that the upper assembly is not in place on top of the lower assembly, as described hereinabove. When the upper assembly is moved into place, actuating rod 190 engages the switch to open the contacts. In this case, $V_{OUT}$ is 1.6-2.0 volts and V' is 0 volts, indicating that the upper assembly is in place and that the MR study may be initiated. It will be recognized that alternate switching arrangements may be advantageously employed to achieve the described variations in $V_{OUT}$ voltage.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. An MR scanner including an RF power amplifier, an RF receiver preamplifier, and an RF coil assembly made up of an upper coil assembly disposed slidably relative to a lower coil assembly, said MR scanner comprising:

transmit/receive switch means having a plurality of switching devices for selectively coupling said power amplifier and said preamplifier to said coil assembly;

switch means operably coupled to said upper coil assembly to shunt at least one of said switching devices in and out of said transmit/receive switch depending on the position of said upper coil assembly so as to change the voltage drop across one of the unshunted switching devices; and comparator circuit means for comparing said voltage drop to a predetermined reference voltage and providing an output signal indicative of the position of said upper coil assembly.

2. The MR scanner of claim 1 wherein said transmit/receive switch means comprises:

means for coupling said RF power amplifier to said RF coil assembly, which means includes a first PIN diode device connected in series therewith;

means for coupling said RF coil assembly to said RF preamplifier, which means includes a pair of series connected quarter wavelength sections of coaxial transmission cable, a second PIN diode device connected between electrical ground and the connecting point between said quarter wavelength sections, and a third PIN diode device connected between electrical ground and the common point between one of said quarter wavelength sections and said RF preamplifier;

means for selectively biasing said PIN diode devices between conductive and nonconductive states, such that when said diode devices are biased into the conductive state said RF power amplifier is coupled to said RF coil assembly, and such that said RF coil assembly is coupled to said RF preamplifier when said diode devices are biased into the nonconductive state; and wherein said switch means is electrically connected in parallel with said second PIN diode device.

3. The MR scanner of claim 1 wherein said transmit/receive switch means comprises:

means for coupling said RF power amplifier to said RF coil assembly, which means includes a first PIN diode device connected in series therewith;

means for coupling said RF coil assembly to said RF preamplifier, which means includes a pair of series connected quarter wavelength sections of coaxial transmission cable, a second PIN diode device connected between electrical ground and the connecting point between said quarter wavelength sections, and a third PIN diode device connected between electrical ground and the common point between one of said quarter wavelength sections and said RF preamplifier;

means for selectively biasing said PIN diode devices between conductive and nonconductive states, such that when said diode devices are biased into the conductive state said RF power amplifier is coupled to said RF coil assembly, and such that said RF coil assembly is coupled to said RF preamplifier when said diode devices are biased into the nonconductive state; and wherein said switch means is electrically connected between the common point between said first PIN diode device and said RF coil assembly and electrical ground.

* * * * *